United States Patent [19]

Kato

[11] Patent Number: 5,099,303

[45] Date of Patent: Mar. 24, 1992

[54] BICMOS INTEGRATED CIRCUIT WITH SHALLOW N-WELLS

[75] Inventor: Takao Kato, Tokyo, Japan

[73] Assignee: Oki Electric Industry Co., Ltd., Tokyo, Japan

[21] Appl. No.: 675,262

[22] Filed: Mar. 27, 1991

[30] Foreign Application Priority Data

Apr. 3, 1990 [JP] Japan .................................. 2-87358

[51] Int. Cl.[5] ............................................ H01L 27/02
[52] U.S. Cl. ............................................ 357/43; 357/42
[58] Field of Search ................................... 357/43, 42

[56] References Cited

U.S. PATENT DOCUMENTS 4,597,874 9/1990 Soejima .............................. 352/43
4,960,726 10/1990 Lechaton et al. .................. 357/43
5,015,594 5/1991 Chu et al. .......................... 357/43

FOREIGN PATENT DOCUMENTS 2819001 11/1978 Fed. Rep. of Germany ........ 357/43
0281545 12/1986 Japan .................................... 357/43
0081970 4/1988 Japan .................................... 357/43

Primary Examiner—Georgia Epps
Attorney, Agent, or Firm—Wenderoth, Lind & Ponack

[57] ABSTRACT

A biCMOS integrated circuit is created on a p-type semiconductor substrate on which first an n-type epitaxial layer then a p-type epitaxial layer is grown. NPN and PMOS transistors are formed in n-wells in the p-type epitaxial layer. n+ buried layers are located below the n-wells at the interface between the substrate and the n-type epitaxial layer. The n+ buried layers underlying the n-wells containing NPN transistors are surrounded by p+ buried layers that extend from the interface between the p-type and n-type epitaxial layers through the n-type epitaxial layer and into the substrate.

6 Claims, 14 Drawing Sheets

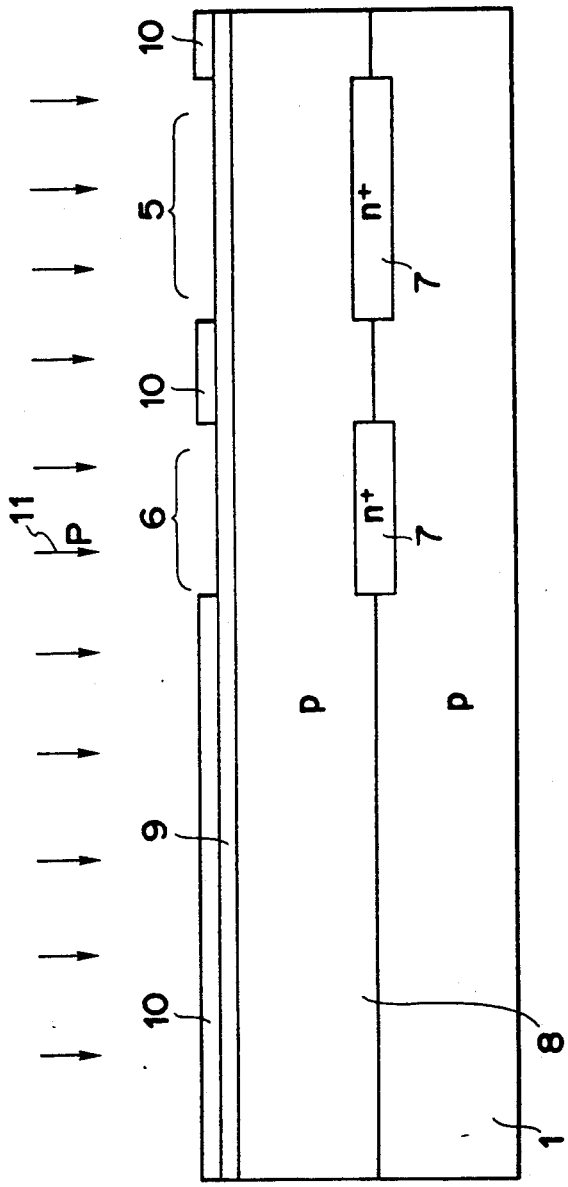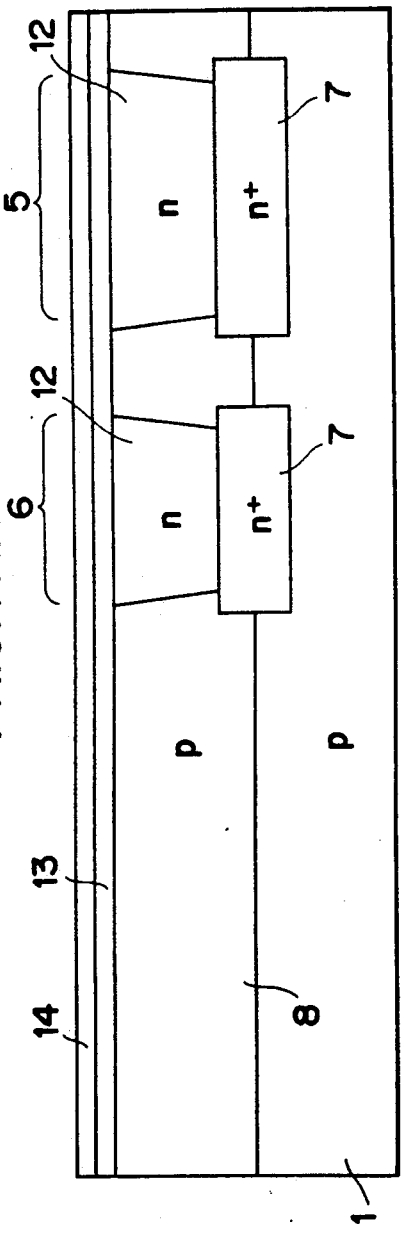

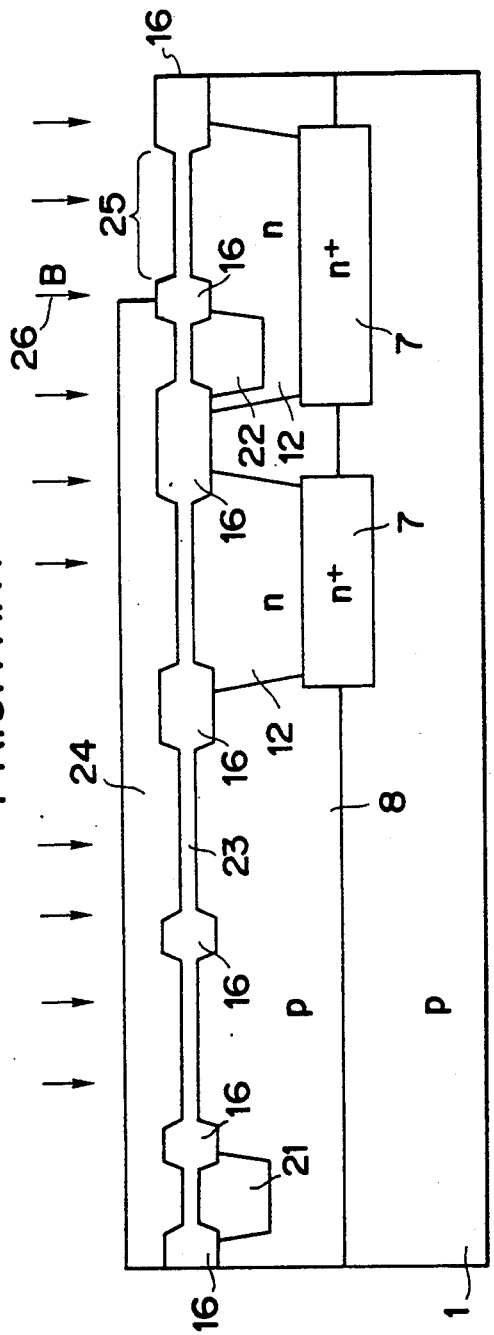
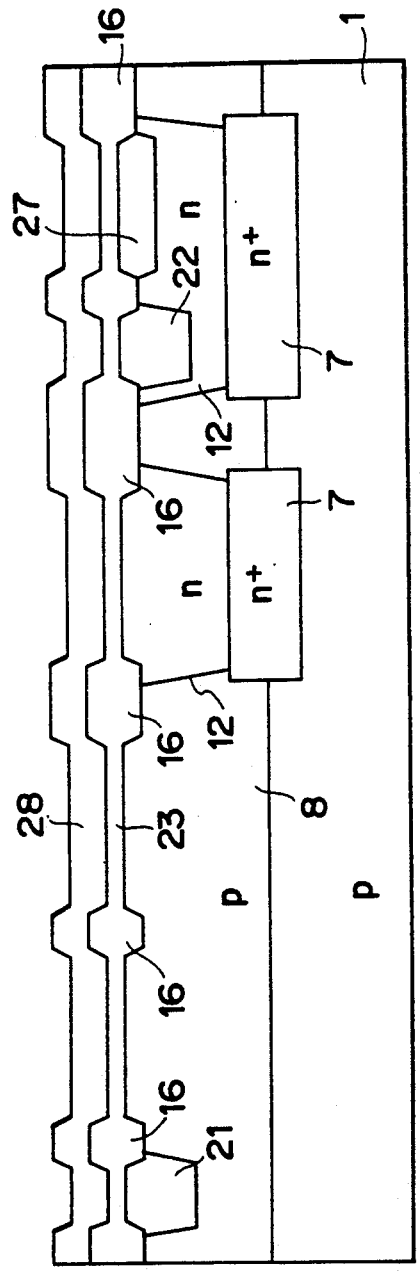

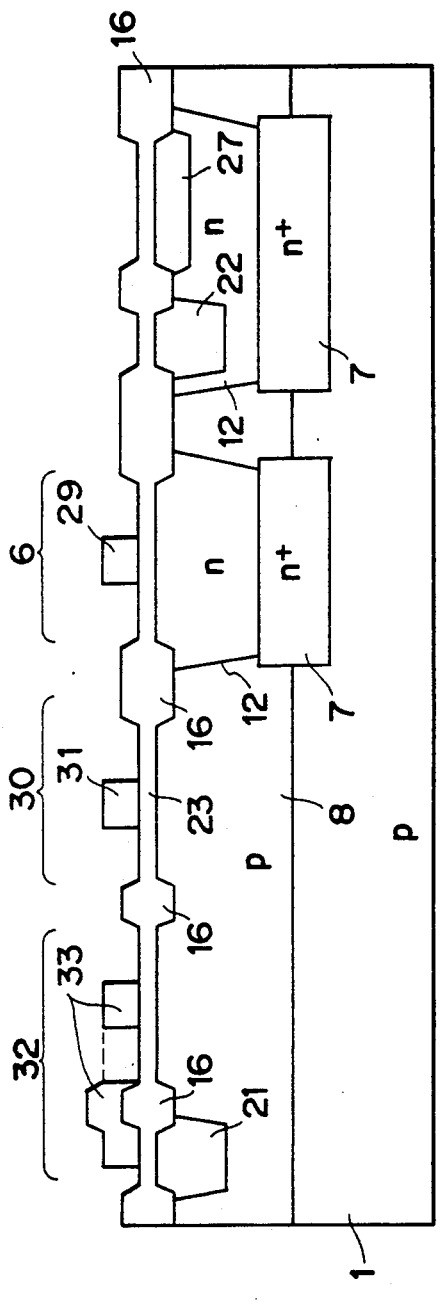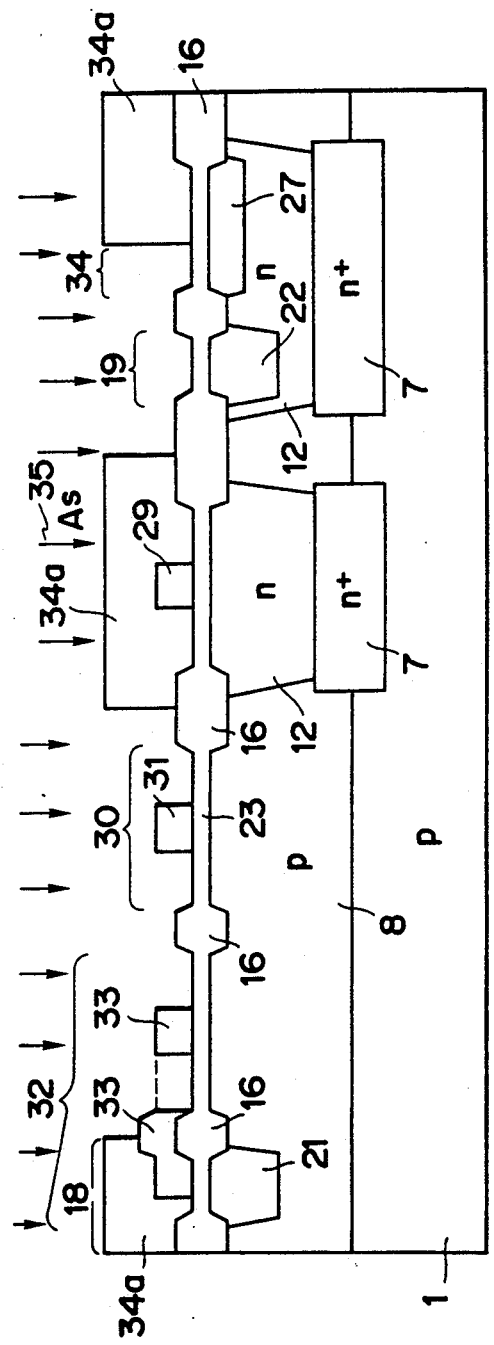

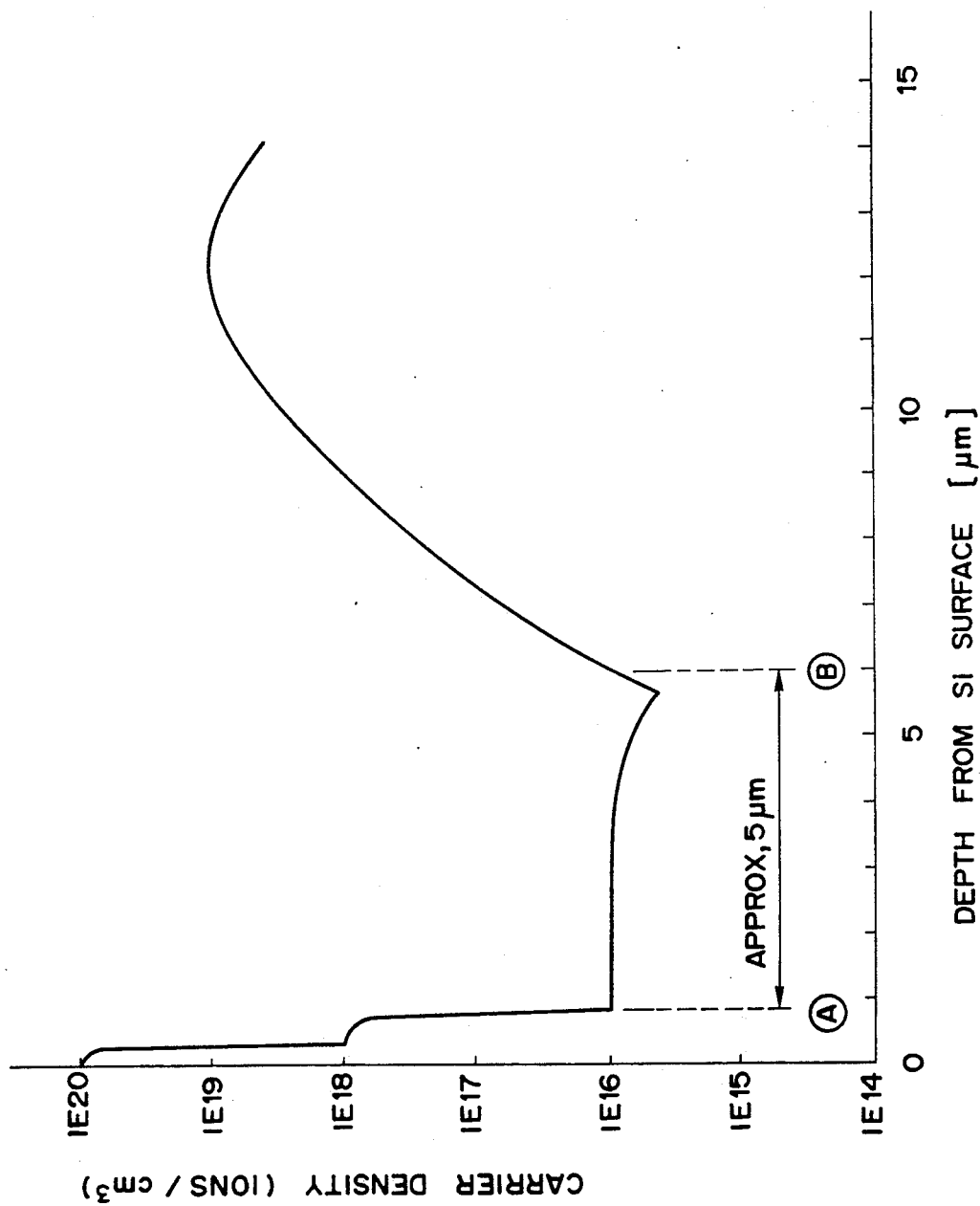

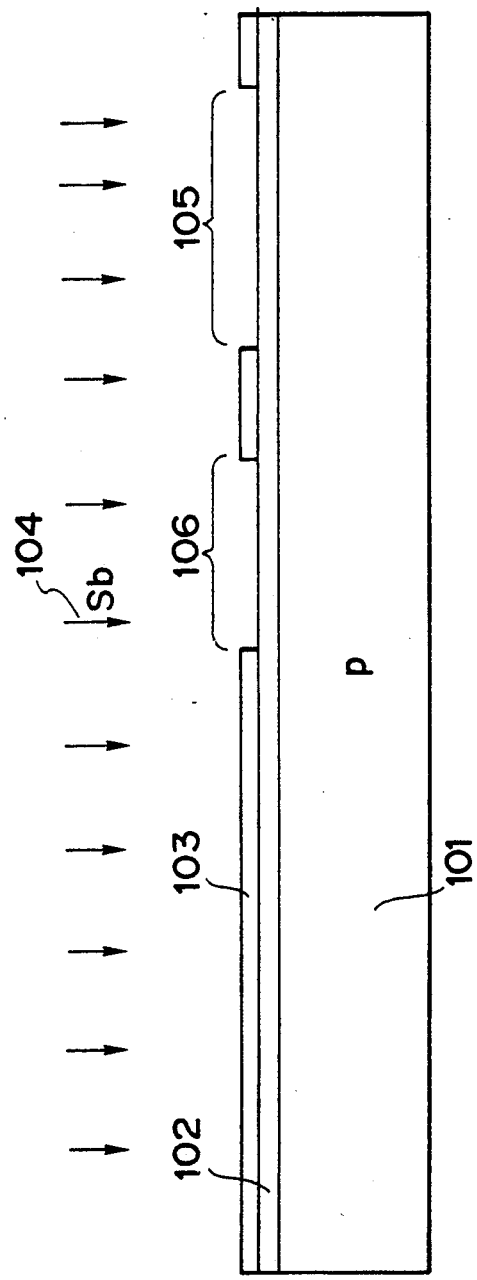
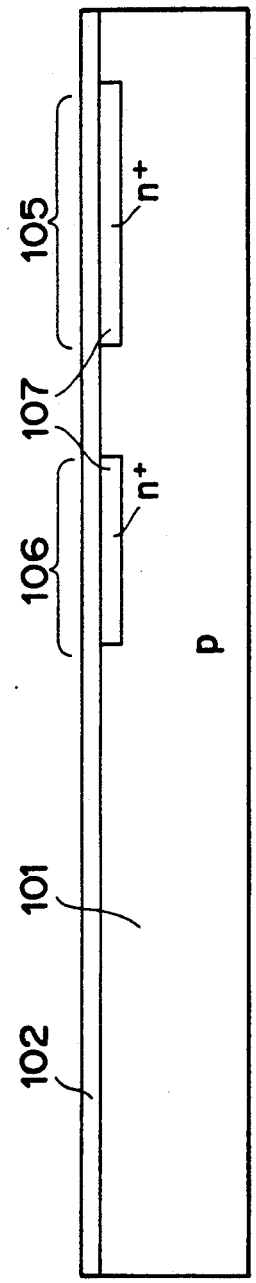
FIG. 3A
FIG. 3B

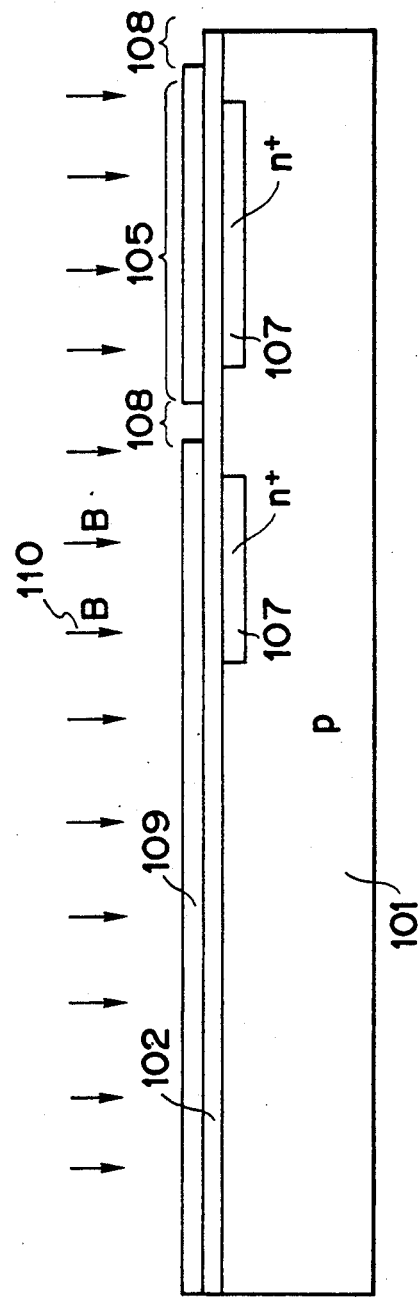
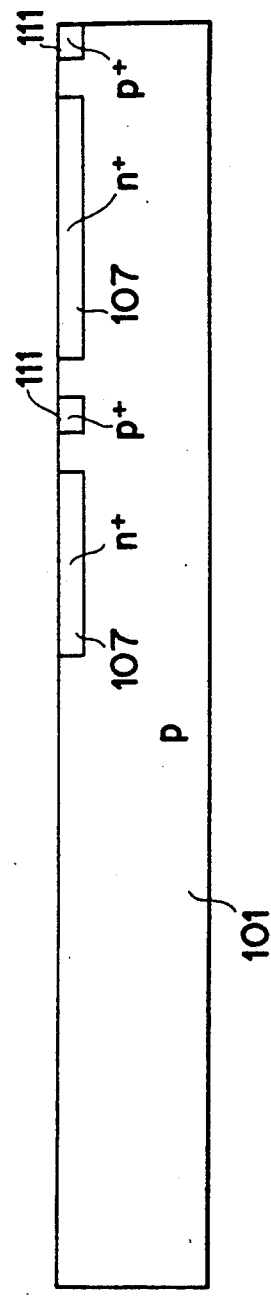

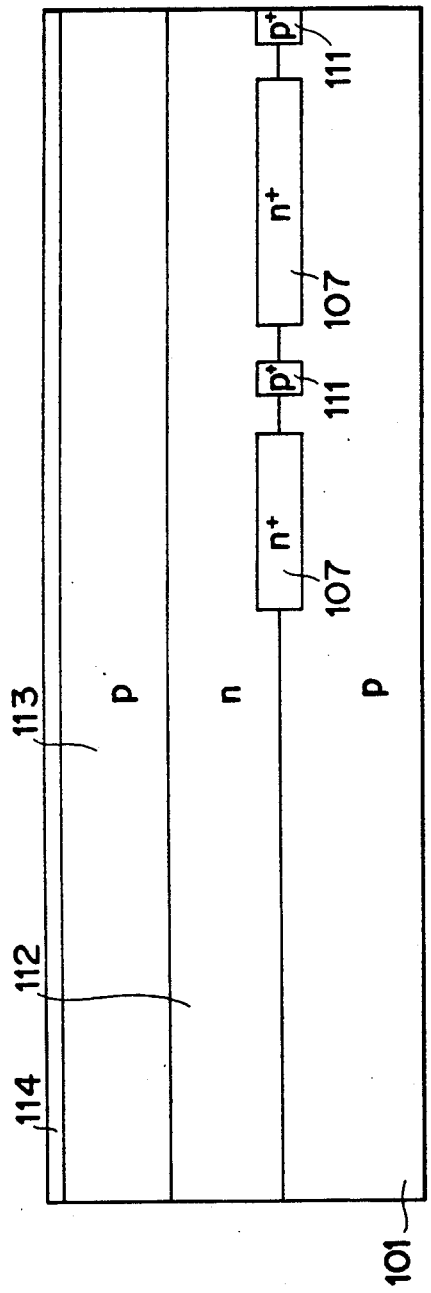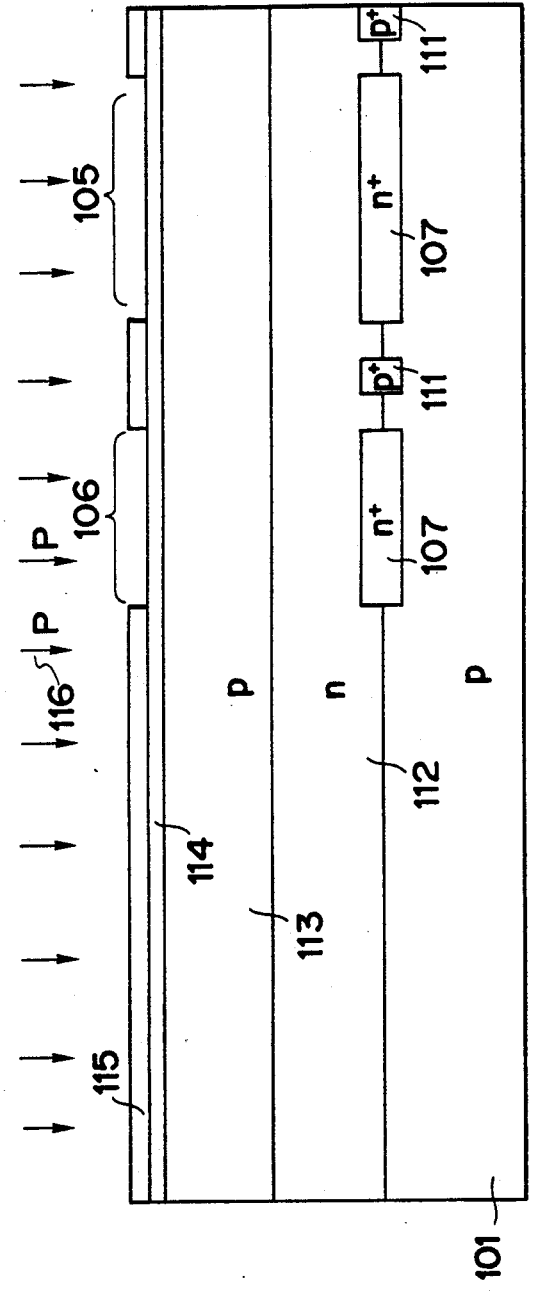

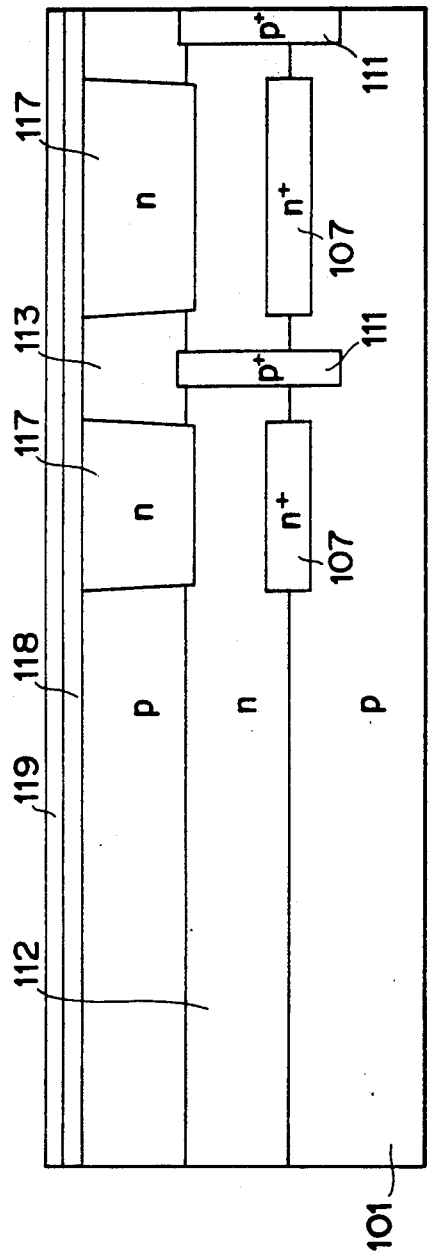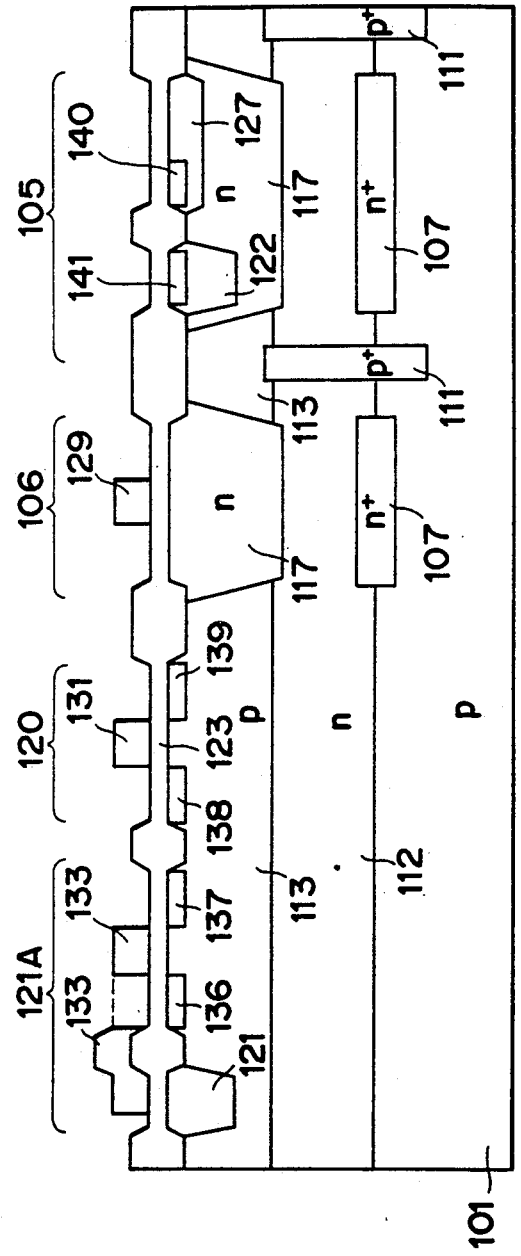

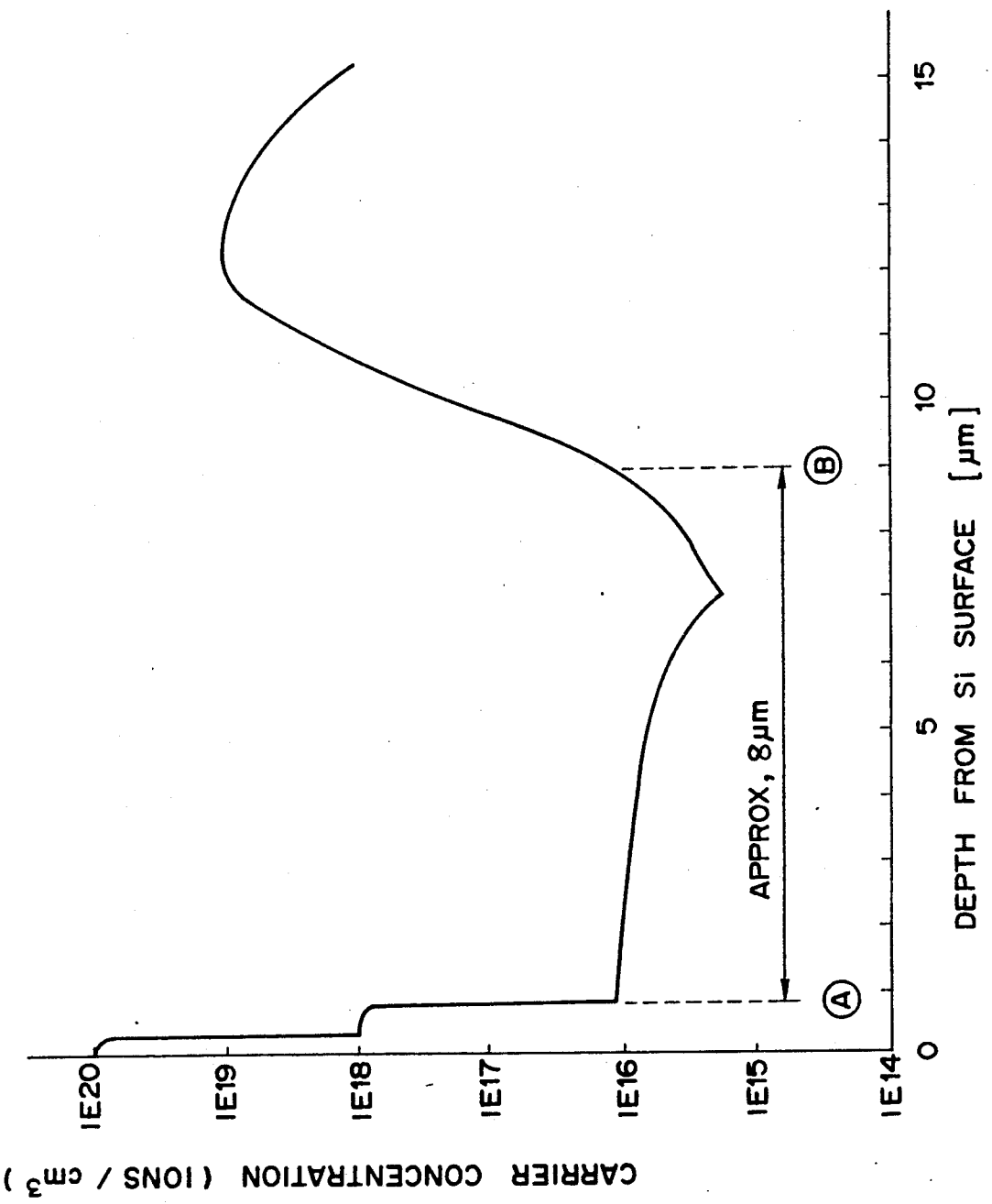

BICMOS INTEGRATED CIRCUIT WITH SHALLOW N-WELLS

BACKGROUND OF THE INVENTION

This invention relates to a semiconductor integrated circuit, more paticularly to a bipolar complementary metal-oxide-semiconductor (biCMOS) integrated circuit having shallow n-wells, and to a fabrication method thereof.

The n-wells in a biCMOS integrated circuit are disposed in a p-type epitaxial layer and contain NPN and PMOS transistors. NMOS transistors are created in the p-type epitaxial layer outside the n-wells. The integrated circuit to be considered further comprises an erasable programmable read-only memory (EPROM), the EPROM cells also being disposed in the p-type epitaxial layer outside the n-wells.

FIGS. 1A to 1O illustrate steps in the fabrication of a prior-art biCMOS integrated circuit with EPROM. These steps are carried out by well-known techniques such as photolithography, ion implantation, and chemical vapor deposition (CVD), detailed accounts of which will be omitted. Although these drawings illustrate the fabrication of only one NPN transistor, one PMOS transistor, one NMOS transistor, and one EPROM memory cell, it will be understood that normally large numbers of these active elements are fabricated simultaneously on the same substrate.

With reference to FIG. 1A, a p-type silicon substrate 1 with a specific resistance of substantially 15 ohms. cm is heated to substantially 1000° C. for substantially 20 minutes in an oxygen ($O_2$) atmosphere to form a silicon dioxide ($SiO_2$) layer 2 substantially 450 angstroms thick. Next, using photolithographic techniques, the surface is coated with a patterned resist 3 covering areas other than a first area 5 and a second area 6. The first area 5 is an area in which an NPN transistor will be formed. The second area is an area in which a PMOS transistor will be formed. Although only one first area and one second area are shown in the drawings, most integrated circuits will have many first areas and many second areas, the steps described below being carried out on all first areas and all second areas simultaneously.

After creation of the resist 3, antimony ions 4 are implanted at an accelerating voltage of 40 keV and dose of $3 \times 10^{15}$ ions/cm$^2$ into the silicon substrate 1 in the first area 5 and the second area 6.

With reference to FIG. 1B, next the resist 3 is removed and the substrate is heated to a temperature of substantially 1200° C. for substantially 500 minutes in a nitrogen ($N_2$) atmosphere to form an n$^+$ buried layer 7 with a sheet resistance of substantially 30 ohms/square and junction depth of substantially 4.5 $\mu$m in the first and second areas 5 and 6. Then the $SiO_2$ layer 2 is removed.

With reference to FIG. 1C, next a p-type monocrystalline silicon epitaxial layer 8 is grown. The epitaxial layer 8 has a specific resistance of substantially 2 ohms.cm and thickness of substantially 12 $\mu$m. The surface is then oxidized in a steam atmosphere at 1000° C. for substantially five minutes to form an $SiO_2$ layer 9 substantially 1000 angstroms thick, after which a resist 10 is formed by photolithography over areas other than the first and second areas 5 and 6. Then phosphorus ions 11 are implanted at an accelerating voltage of 100 keV and dose of $2 \times 10^{13}$ ions/cm$^2$ into the p-type monocrystalline epitaxial layer 8 in the first and second areas 5 and 6.

With reference to FIG. 1D, the resist 10 is now removed and heat treatment is carried out at a temperature of substantially 1200° C. for substantially 1200 minutes in an $N_2$ atmosphere to form n-wells 12 with a sheet resistance of substantially 800 ohms/square and a junction depth of substantially 6 $\mu$m in the first and second areas 5 and 6. Next the $SiO_2$ layer 9 is removed and the surface is oxidized at substantially 950° C. for substantially 50 minutes in an $O_2$ atmosphere to form a new $SiO_2$ layer 13 substantially 300 angstroms thick. Then an $Si_3N_4$ layer 14 substantially 2000 angstroms thick is deposited on the surface by chemical vapor deposition.

With reference to FIG. 1E, the $Si_3N_4$ layer 14 is now removed from element isolation areas 15 by photolithographic etching.

With reference to FIG. 1F, the surface is now oxidized in a steam atmosphere at substantially 1000° C. for substantially 200 minutes to form isolation oxide layers 16 substantially 8000 angstroms thick, after which the $Si_3N_4$ layer 14 is removed.

With reference to FIG. 1G, areas other than an EPROM control gate area 18 and an NPN transistor collector area 19 are now covered by a resist 17, formed by photolithography. Then phosphorus ions 20 are implanted into the EPROM control gate area 18 and the NPN transistor collector area 19 at an accelerating voltage of substantially 60 keV and dose of substantially $1 \times 10^{15}$ ions/cm$^2$.

With reference to FIG. 1H, the resist 17 is now removed and the surface is heated to substantially 1100° C. for substantially 120 minutes in an $N_2$ atmosphere to form a control gate 21 and deep collector 22 having a sheet resistance of substantially 60 ohms/square and junction depth of substantially 2 $\mu$m.

With reference to FIG. 1I, next the $SiO_2$ layer 13 is etched away and the exposed surface is oxidized at substantially 850° C. for substantially 30 minutes in a steam atmosphere to form a gate oxide layer 23 substantially 350 angstroms thick. A resist 24 is then formed by photolithography in areas other than an NPN transistor base area 25, and boron ions 26 are implanted into the NPN transistor base area 25 at an accelerating voltage of substantially 40 keV and dose of substantially $1 \times 10^{14}$ ions/cm$^2$.

With reference to FIG. 1J, the resist 24 is removed and the exposed surface is oxidized at substantially 1000° C. for substantially 30 minutes in a steam atmosphere to form a base 27 having a sheet resistance of substantially 500 ohms/square and junction depth of substantially 0.8 $\mu$m. Then a layer of polysilicon 28 substantially 2000 angstroms thick is formed by chemical vapor deposition, after which a thermal diffusion step is performed, using POCl$_3$ to diffuse phosphorus into the polysilicon 28, the resulting phosphorus-doped polysilicon 28 having a sheet resistance of substantially 20 ohms/square.

With reference to FIG. 1K, the polysilicon 28 is next patterned by photolithographic etching to form a PMOS gate electrode 29 in the second area 6, an NMOS gate electrode 31 in a third area 30, and a floating gate 33 in a fourth area 32. The third area is an area in which an NMOS transistor will be formed. The fourth area 32 is an area in which an EPROM memory cell will be formed. The dotted line in the drawing indicates that the portions of the floating gate 33 to the left and right of the dotted line are interconnected.

With reference to FIG. 1L, a resist 34a is now formed by photolithography in the control gate area 18 of the fourth area 32, and in remaining areas other than the NPN transistor collector area 19, an NPN transistor emitter area 34, the third area 30, and the rest of the fourth area 32. Arsenic ions 35 are then implanted into the areas not covered by the resist 34a, at an accelerating voltage of substantially 40 keV and dose of substantially $1 \times 10^{16}$ ions/cm$^2$.

With reference to FIG. 1M, the resist 34a is now removed and the device is heated to substantially 950° C. for substantially 100 minutes in an N$_2$ atmosphere to form a diffusion layer with a sheet resistance of substantially 35 ohms/square and diffusion depth of substantially 0.3 µm, thereby creating a source 36 and drain 37 in the fourth area 32, a source 38 and drain 39 in the third area 30, and an emitter 40 and collector 41 in the first area 5.

With reference to FIG. 1N, a resist is now formed by photolithography over areas other than the second area 6. An ion implantation step is then performed in which BF$_2$ 43 is implanted at an accelerating voltage of substantially 40 keV and a dose of substantially $1 \times 10^{16}$ ions/cm$^2$, thereby introducing boron into the second area 6.

With reference to FIG. 10, the resist 42 is removed and the exposed surface is heated to substantially 900° C. for substantially 20 minutes in an N$_2$ atmosphere to form a diffusion layer having a sheet resistance of 150 ohms/square and junction depth of substantially 0.25 µm, thereby creating a source 44 and drain 45 in the second area 6.

As a result of this process an NPN transistor is formed in the first area 5, a PMOS transistor is formed in the second area 6, an NMOS transistor is formed in the third area 30, and an EPROM cell is formed in the fourth area 32. The NPN transistor has the carrier profile illustrated in FIG. 2. The distance from the bottom of the base, marked with a circled letter A, to the top of the n+ buried layer, marked with a circled letter B, is substantially 5 µm.

A problem in this prior-art process is that the maximum voltage that can be withstood between the collector and emitter of the NPN transistor is only about 10 to 20 volts, considerably less than the 40 to 100 volts required, for example, to drive a fluorescent display tube. The reason for this low withstanding voltage is the short distance between the base 27 of the NPN transistor and the n+ buried layer 7. This short distance is in turn a result of the long heat-treatment step illustrated in FIG. 1D, which causes the n+ buried layer 7 to diffuse upward by substantially 6 µm, leaving only about 5 µm between the base 27 and the n+ buried layer 7.

The withstanding voltage cannot be increased simply by increasing the thickness of the epitaxial layer 8, because then still further heat treatment becomes necessary to form the n-wells 12, leading to even further upward diffusion from the n+ buried layer 7.

SUMMARY OF THE INVENTION

It is accordingly an object of the present invention to enable the NPN transistors of a biCMOS integrated circuit to withstand high voltages.

Another object of the present invention is to provide a method of fabricating such integrated circuits.

The invented semiconductor integrated circuit comprises a p-type semiconductor substrate, an n-type monocrystalline epitaxial layer grown on the substrate, and a p-type monocrystalline epitaxial layer grown on the n-type epitaxial layer. An n+ buried layer is disposed in certain parts of the p-type semiconductor substrate and adjacent parts of the n-type epitaxial layer. A p+ buried layer is disposed in the n-type epitaxial layer surrounding at least one part of the n+ buried layer, making contact with both the substrate and the p-type epitaxial layer. At least one n-well, containing an NPN bipolar transistor, is disposed in the p-type epitaxial layer, meeting the n-type epitaxial layer in an area surrounded by the p+ buried layer.

BRIEF DESCRIPTION OF THE DRAWINGS

FIGS. 1A to 10 illustrate steps in a prior-art biCMOS integrated circuit fabrication method.

FIG. 2 illustrates the carrier concentration profile of the NPN transistor in FIG. 10.

FIGS. 3A to 3H illustrate steps in a novel biCMOS integrated circuit fabrication method.

FIG. 4 illustrates the carrier concentration profile of the NPN transistor in FIG. 3H.

DETAILED DESCRIPTION OF THE INVENTION

Figure 1A:
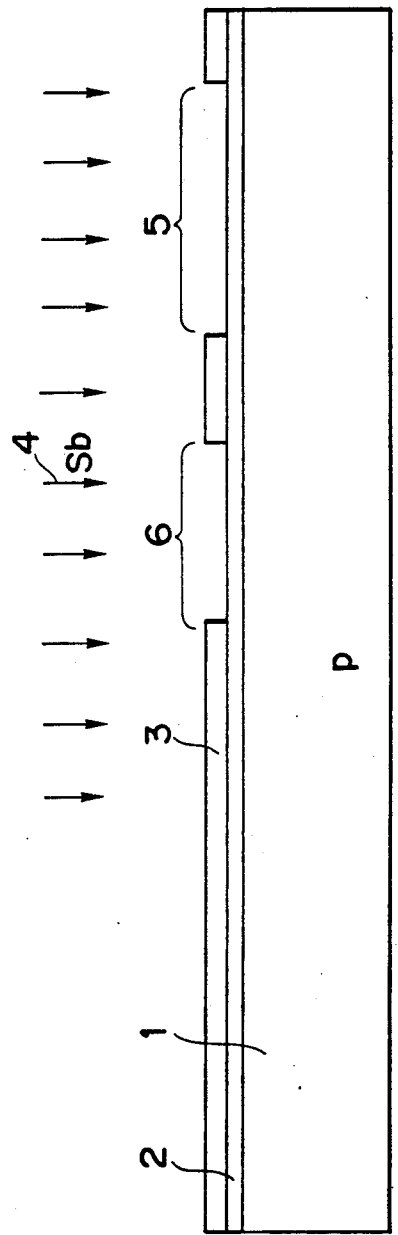
Figure 1B:
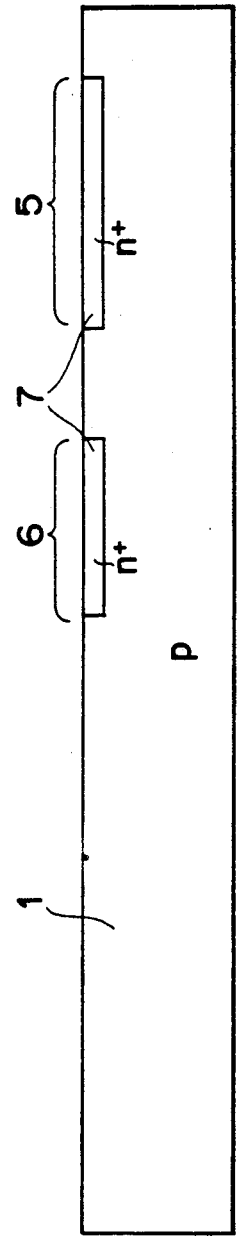

A novel biCMOS integrated circuit fabrication method will be illustrated with reference to FIGS. 3A to 3H. FIGS. 3A to 3G illustrate the novel steps in the fabrication process; FIG. 3H illustrates the novel integrated circuit fashioned by the novel method. These drawings depict a preferred embodiment of the invention but do not limit the scope of the invention, which should be determined solely from the appended claims.

With reference to FIG. 3A, the process starts from a p-type silicon substrate 101 having a specific resistance of substantially 15 ohms.cm. The substrate 101 is heated to substantially 1000° C. for substantially 20 minutes in an O$_2$ atmosphere to form an SiO$_2$ layer 102 substantially 450 angstroms thick. Next, a resist 103 is applied and patterned by photolithography so that it covers areas other than a first area 105, in which an NPN transistor will be formed, and a second area 106, in which a PMOS transistor will be formed. Although only one of each type of area is illustrated in the drawings, normally there will be many first areas 105 and second areas 106, the steps described below being carried out on all first areas and all second areas simultaneously. Next antimony ions 104 are implanted at an accelerating voltage of 40 keV and dose of $3 \times 10^{15}$ ions/cm$^2$ into the first and second areas 105 and 106.

With reference to FIG. 3B, the resist 103 is now removed and the device is heated in a N$_2$ atmosphere at substantially 1200° C. for substantially 500 minutes to form an n+ buried layer 107 having a sheet resistance of 30 ohms/square and junction depth of substantially 4.5 µm in the first and second areas 105 and 106.

With reference to FIG. 3C, a resist 109 is now applied and patterned by photolithography to cover all areas other than isolation areas 108 around the first area 105. Then boron ions 110 are implanted at an accelerating voltage of 60 keV and dose of $2 \times 10^{14}$ ions/cm$^2$ into the isolation areas 108.

With reference to FIG. 3D, the resist 109 is now removed and a p+ buried layer 111 having a sheet resistance of 300 ohms/square and junction depth of substantially 1.3 µm is formed in the isolation areas 108 by heat treatment in an $N_2$ atmosphere at substantially 1080° C. for substantially 30 minutes. Then the $SiO_2$ layer 102 is removed.

With reference to FIG. 3E, an n-type monocrystalline silicon epitaxial layer 112 with a specific resistance of 5 ohms.cm and thickness of 8 μm is now grown on the surface of the substrate 101, after which a p-type monocrystalline silicon epitaxial layer 113 with a specific resistance of 2 ohms.cm and thickness of 4 μm is grown on the surface of the n-type monocrystalline epitaxial layer 112. Then an $SiO_2$ layer 114 substantially 1000 angstroms thick is formed by oxidation in a steam atmosphere at substantially 1000° C. for substantially five minutes. During this step the buried n+ and p+ layers 107 and 111 diffuse part-way into the n-type epitaxial layer 112.

With reference to FIG. 3F, a resist 115 is now formed by photolithography over all areas other than the first and second areas 105 and 106. Then phosphorus ions 116 are implanted at an accelerating voltage of 100 keV and dose of $1 \times 10^{13}$ ions/cm² into the first and second areas 105 and 106 of the p-type monocrystalline epitaxial layer 113.

With reference to FIG. 3G, the resist 115 is removed and n-wells 117 with a sheet resistance of 1500 ohms/square and depth of substantially 4.5 μm are formed in the p-type monocrystalline epitaxial layer 113, making contact with the n-type monocrystalline epitaxial layer 112, by heat treatment in an $N_2$ atmosphere at substantially 1200° for substantially 400 minutes. The p+ buried layer 111 is also diffused by this step, causing it to extend through the n-type monocrystalline epitaxial layer 112 and make contact with the p-type monocrystalline epitaxial layer 113. The n+ buried layer 107 is also diffused, but to a much lesser extent, because antimony has a much higher atomic weight than boron and phosphorus.

Next the $SiO_2$ layer 114 is removed and another $SiO_2$ layer 118 substantially 300 angstroms thick is formed by oxidation in an $O_2$ atmosphere at substantially 950° C. for substantially 50 minutes, after which an $Si_3N_4$ layer 119 substantially 2000 angstroms thick is formed by chemical vapor deposition.

Figure 1E:
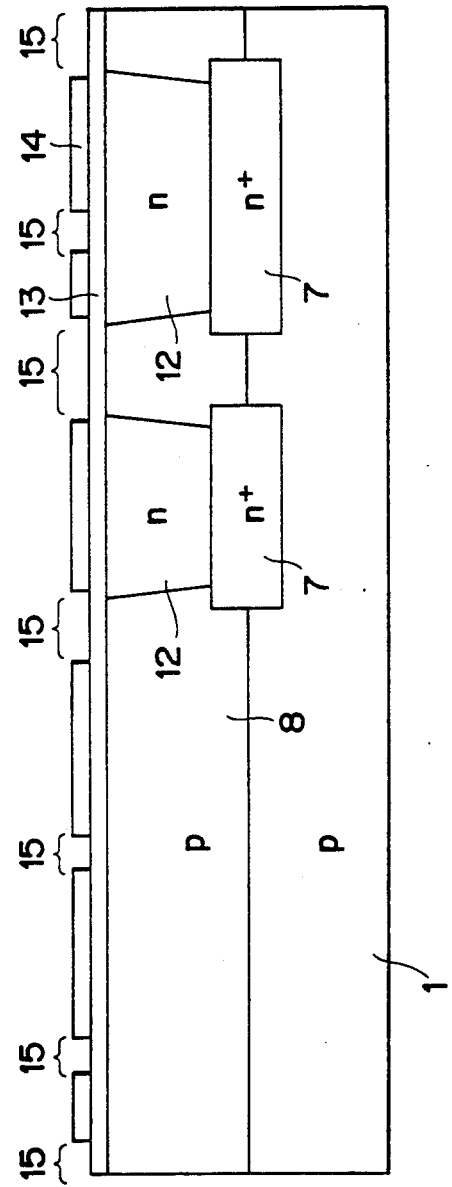
Figure 1F:
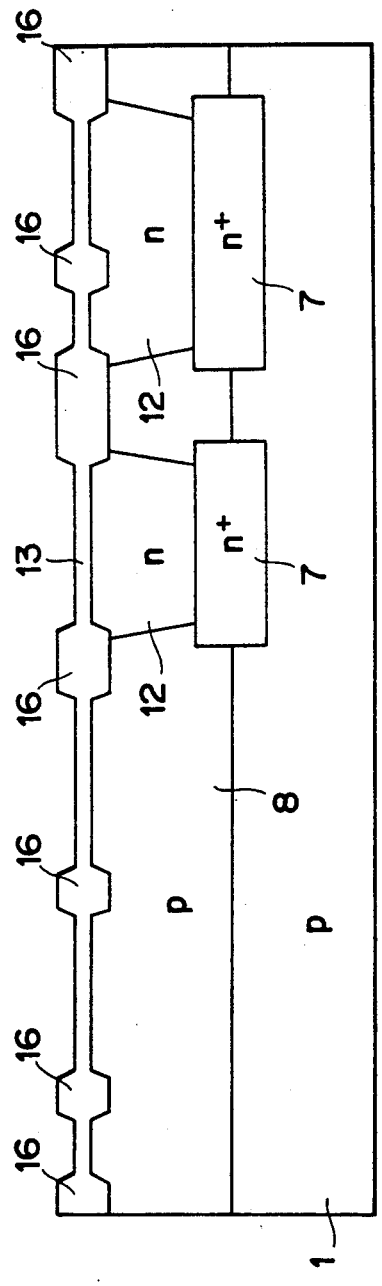
Figure 1G:
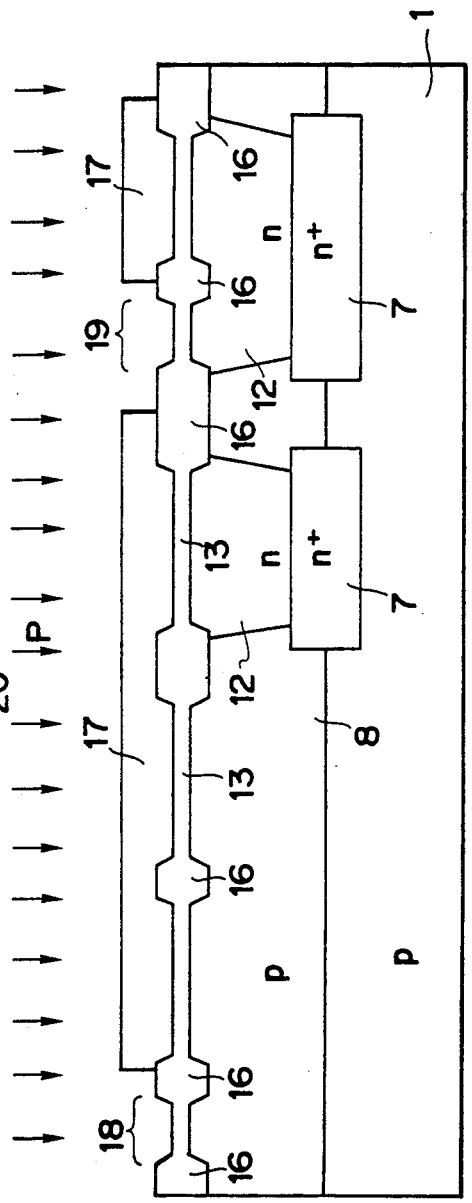
Figure 1H:
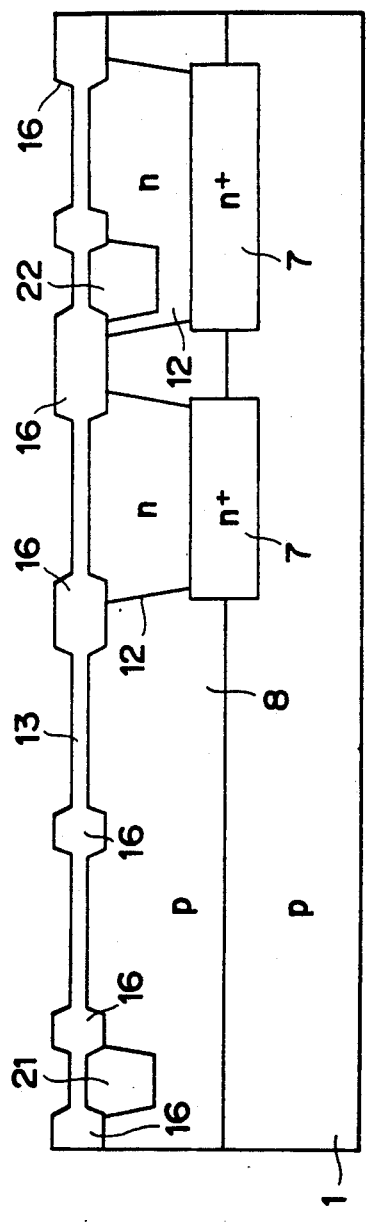
Figure 1M:
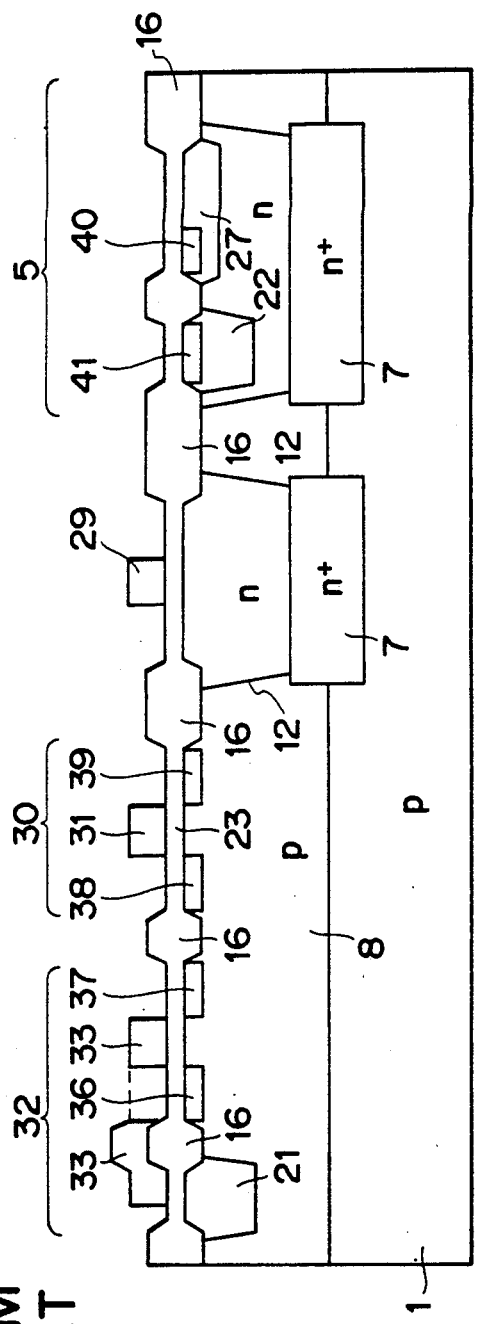
Figure 1N:
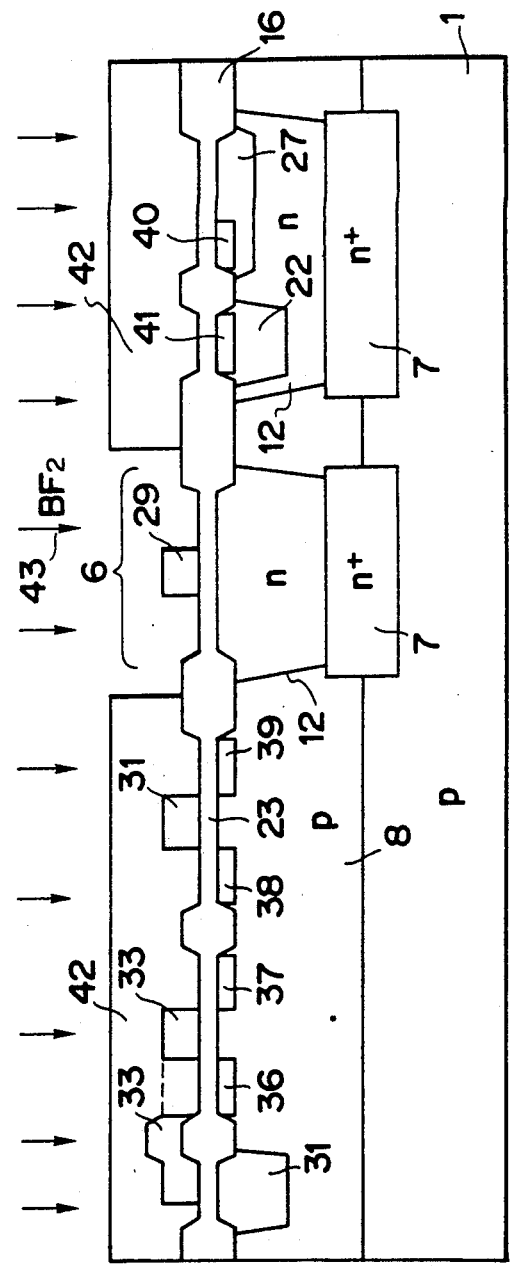
Figure 10:
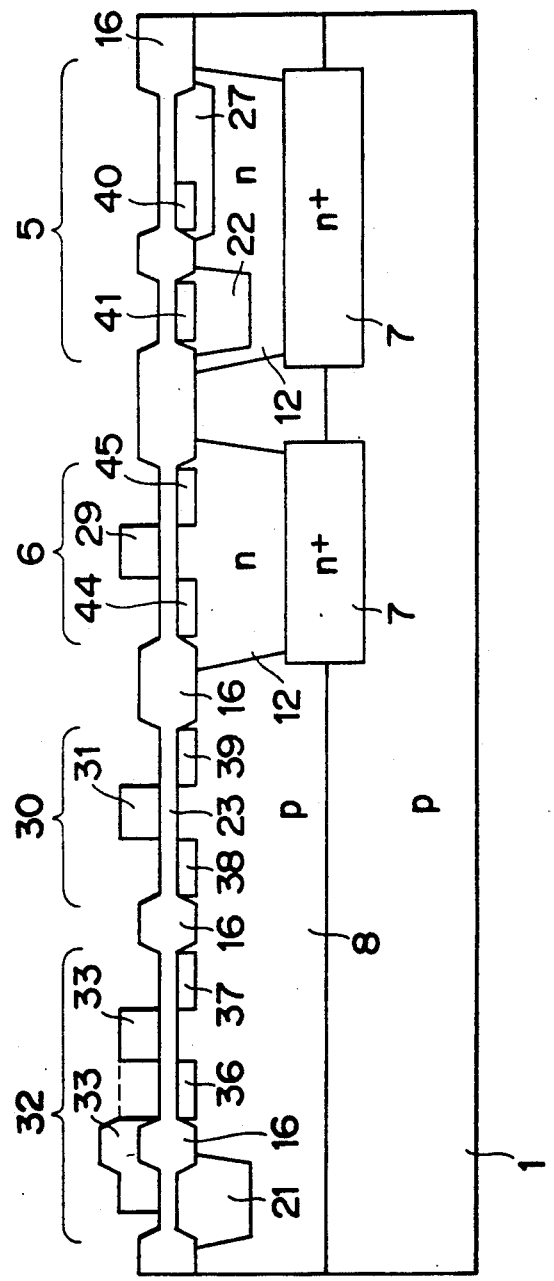

With reference to FIG. 3H, the steps illustrated in FIGS. 1E to 1O of the prior-art process are now carried out to create the following active elements: an NPN transistor comprising a deep collector 122, a base 127, a collector 141, and an emitter 140 in the n-well 117 in the first area 105; a PMOS transistor comprising a gate electrode 129 and a source and a drain (not explicitly marked in the drawing) in the second area 106; an NMOS transistor comprising a gate electrode 131 overlying the oxide layer 123, and a source 138 and a drain 139, in a third area 120; and an EPROM cell comprising a source 136, a drain 137, a floating gate 133, and a control gate 121 in a fourth area 121A.

The carrier concentration profile of the NPN transistor is shown in FIG. 4. The distance from the bottom of the base, marked with a circled letter A, to the top of the n+ buried layer, marked with a circled letter B, is substantially 8 μm, considerably more than the 5 μm of the prior art. This increased distance enables the NPN transistor to withstand higher collector-emitter voltages than in the prior art.

The reason for the increased distance from A to B is that while the epitaxial layer has the same total thickness of 12 μm as in the prior art, it has a double structure, comprising the 8 μm n-type epitaxial layer 112 and 4 μm p-type epitaxial layer 113. The n-wells 117 need be formed only in the p-type epitaxial layer 113, hence they can be formed with less heat treatment than in the prior art. Specifically, the heat treatment step in FIG. 3G that forms the n-wells lasts only 400 minutes, while the corresponding step in the prior-art process, illustrated in FIG. 1D, lasted 1200 minutes. In the novel process, therefore, less upward diffusion of the n+ buried layer occurs than in the prior-art process, leaving more distance between the n+ buried layer and the base of the NPN transistor.

The saving in time by shortening the heat treatment step that forms the n-wells from 1200 minutes to 400 minutes is a significant auxiliary benefit.

What is claimed is:

1. A semiconductor integrated circuit comprising:
   a p-type semiconductor substrate;
   an n-type monocrystalline epitaxial layer grown on said p-type semiconductor substrate;
   a p-type monocrystalline epitaxial layer grown on said n-type monocrystalline epitaxial layer;
   an n+ buried layer disposed in certain areas of said p-type semiconductor substrate and adjacent areas of said n-type monocrystalline epitaxial layer;
   a p+ buried layer disposed in said n-type monocrystalline epitaxial layer, surrounding at least one part of said n+ buried layer, making contact with both said p-type semiconductor substrate and said p-type monocrystalline epitaxial layer;
   at least one first n-well disposed in said p-type monocrystalline epitaxial layer, meeting said n-type monocrystalline epitaxial layer in an area surrounded by said p+ buried layer; and
   an NPN bipolar transistor disposed in said first n-well.

2. The integrated circuit of claim 1, also comprising:
   at least one second n-well disposed in said p-type monocrystalline epitaxial layer above an area of said n+ buried layer not surrounded by said p+ buried layer, and making contact with said n-type monocrystalline epitaxial layer; and
   a PMOS transistor disposed in said second n-well.

3. The integrated circuit of claim 2, also comprising NMOS transistors.

4. The integrated circuit of claim 3, also comprising EPROM memory cells.

5. The integrated circuit of claim 1, wherein said p-type substrate, said n-type monocrystalline epitaxial layer, and said p-type monocrystalline epitaxial layer comprise monocrystalline silicon.

6. The integrated circuit of claim 5, wherein said n-type monocrystalline epitaxial layer is substantially 400 μm thick and said p-type monocrystalline epitaxial layer is substantially 800 μm thick.

* * * * *